(12) United States Patent
Gonska et al.

(10) Patent No.: US 9,988,261 B2
(45) Date of Patent: Jun. 5, 2018

(54) MICROMECHANICAL DEVICE AND METHOD FOR MANUFACTURING A MICROMECHANICAL DEVICE

(71) Applicant: Robert Bosch GmbH, Stuttgart (DE)

(72) Inventors: Julian Gonska, Reutlingen (DE); Jochen Reinmuth, Reutlingen (DE); Kathrin Gutsche, Oberhausen (DE)

(73) Assignee: ROBERT BOSCH GMBH, Stuttgart (DE)

(*) Notice: Subject to any disclaimer, the term of this patent is extended or adjusted under 35 U.S.C. 154(b) by 507 days.

(21) Appl. No.: 13/917,044

(22) Filed: Jun. 13, 2013

(65) Prior Publication Data

US 2013/0334622 A1 Dec. 19, 2013

(30) Foreign Application Priority Data

Jun. 14, 2012 (DE) .......................... 10 2012 209 973

(51) Int. Cl.
*B81B 7/00* (2006.01)
*B81B 3/00* (2006.01)
*B81C 1/00* (2006.01)
*B81B 7/02* (2006.01)

(52) U.S. Cl.
CPC .......... *B81B 3/0018* (2013.01); *B81B 7/0038* (2013.01); *B81B 7/02* (2013.01); *B81C 1/00134* (2013.01); *B81B 2201/025* (2013.01)

(58) Field of Classification Search
USPC .............................. 73/514.2, 514.13, 514.12
See application file for complete search history.

(56) References Cited

U.S. PATENT DOCUMENTS

| 5,756,901 | A | 5/1998 | Kurle et al. |
| 6,030,850 | A | 2/2000 | Kurle et al. |
| 6,923,625 | B2* | 8/2005 | Sparks ...................... B32B 9/00 252/181.5 |
| 7,148,077 | B2* | 12/2006 | Fuertsch ................. B81B 3/007 257/419 |
| 2007/0125178 | A1* | 6/2007 | Rosenau ............... G01L 9/0095 73/724 |
| 2008/0213539 | A1* | 9/2008 | Souriau ............... B81C 1/00285 428/156 |

(Continued)

FOREIGN PATENT DOCUMENTS

DE 195 37 814 4/1997

*Primary Examiner* — Hezron E Williams
*Assistant Examiner* — Tarun Sinha
(74) *Attorney, Agent, or Firm* — Norton Rose Fulbright US LLP; Gerard Messina

(57) ABSTRACT

A micromechanical device, in particular a sensor device, and a method for manufacturing a micromechanical device are provided. The micromechanical device has a housing, the housing including a first cavity, and the housing including a second cavity that is separate from the first cavity. The micromechanical device is configured in such a way that a predetermined first gas pressure prevails in the first cavity, and a predetermined second gas pressure which is reduced compared to the first gas pressure prevails in the second cavity. A heating element is situated in the area of the second cavity. The micromechanical device has a printed conductor, the heating element being heatable with the aid of the printed conductor.

5 Claims, 4 Drawing Sheets

(56) References Cited

U.S. PATENT DOCUMENTS

2010/0025845 A1* 2/2010 Merz .................. B81B 7/0038
                                                    257/723
2010/0028618 A1* 2/2010 Gonska ................. B81B 7/02
                                                    428/188

* cited by examiner

MICROMECHANICAL DEVICE AND METHOD FOR MANUFACTURING A MICROMECHANICAL DEVICE

CROSS REFERENCE

The present application claims the benefit under 35 U.S.C. § 119 of German Patent Application No. DE 102012209973.5 filed on Jun. 14, 2012, which is expressly incorporated herein by reference in its entirety.

FIELD

The present invention relates to a micromechanical device and a method for manufacturing a micromechanical device.

BACKGROUND INFORMATION

Conventional manufacturing methods for yaw rate sensors and acceleration sensors are available. In one widely used method, a plurality of freestanding functional structures made of polycrystalline semiconductor material, for example, is provided on a substrate. Partially buried printed conductors and electrodes are situated beneath these functional layers, as is described in German Patent Application No. DE 195 37 814 A1. The micromechanical structures produced in this way are often sealed with a cap wafer or a cap substrate in the further process sequence for manufacturing micromechanical devices. Depending on the application, a suitable pressure is enclosed within the closed volume produced by closing the housing. In yaw rate sensors, a comparatively low pressure, i.e., a gas composition having a comparatively low pressure, is normally enclosed, typically at a pressure of 1 mbar (i.e., 1 hPa). The basis is that in these sensors a portion of the movable structure is resonantly driven. At a fairly low pressure, such an excitation motion may be generated with relatively low voltages due to the low damping. In contrast, in acceleration sensors it is not desirable for the micromechanical structure of the sensor to be set in vibration, which would be possible if an external acceleration were applied. Therefore, these sensors are normally operated at higher internal pressures of the closed volume, i.e., the cavern, typically at 500 mbar (500 hPa).

For the combined manufacture of yaw rate sensors and acceleration sensors, it is possible to implement a yaw rate sensor as well as an acceleration sensor on a substrate, and via a shared cap wafer which for each functional unit of such a combined sensor system, i.e., for each chip, provides two caverns or cavities that are closed by the substrate and the cap substrate. The sensors are thus encapsulated on the substrate level. However, conventionally, it is comparatively complicated and expensive in such a case to implement different pressures in the cavity of the yaw rate sensor and in the cavity of the acceleration sensor, since this normally requires a comparatively large surface area usage for producing a getter layer, and an increased level of effort for sealing same during manufacture, prior to closing the sensor housing.

SUMMARY

An example micromechanical device according to the present invention and an example method according to the present invention for manufacturing same may have the advantage that a micromechanical device having a first cavity at a predetermined first (higher) gas pressure and a second cavity at a predetermined second gas pressure which is reduced compared to the first gas pressure may be cost-effectively manufactured, the micromechanical device having a housing such that the first and the second cavities are enclosed together in the sense that a shared closure of both the first and the second cavity is provided at the same time, i.e., also having an identical enclosed gas pressure. For setting different pressures according to example embodiments of the present invention, in particular different predetermined, i.e., defined, pressures, in different cavities of the micromechanical device, it is provided that a getter material is situated in the second cavity (or if a third cavity is present, also in the third cavity) in such a way that a second gas pressure which is different, in particular reduced, compared to the first cavity thus prevails in the second cavity (or in the second and the third cavities), since, due to the getter material, gas molecules of the gas or the gas composition enclosed in the second (or second and third) cavity are captured either by a direct chemical bond or by absorption, and the gas pressure of the gas or the gas composition enclosed in the particular cavity is thus changed as a whole.

According to the present invention, it is provided that a heating element is situated in the area of the second cavity, the heating element being heatable with the aid of a printed conductor, in particular a buried printed conductor. As a result of the heating element it is advantageously possible to activate the getter material by heating, i.e., to trigger the getter process. In particular, via the printed conductor and a current flow either through the heating element or through the getter material itself, for example in the form of a titanium layer, the getter material is heated in the sense of a sacrificial layer, so that a portion of the getter material of the sacrificial layer vaporizes (preferably sublimates) and deposits in surface areas of the second cavity. The deposited material of the getter layer or the getter material has a getter effect, and in the second cavern reduces the gas pressure of the original first gas composition in such a way that the second gas composition having the second (lower) gas pressure results in the second cavity. According to the present invention, it is in particular advantageously possible to use standard materials (such as titanium) as the getter material in the semiconductor manufacture. According to the present invention, the getter step may be carried out in a very controlled manner, independently of the overall process flow for manufacturing the micromechanical device. The getter layer is activated in particular via the external application of a current over the printed conductor or the buried printed conductor for heating the heating element, and thus the getter material. This means that the getter layer may be activated only at the very end of the manufacturing process, namely, during the electrical testing of the components. At the same time, it is thus also possible according to the present invention for the result of the getter process, i.e., the successful carrying out of the getter process, to be directly checked by measuring the damping. According to the present invention, it is also possible to pump out fairly large caverns, since the getter layer (i.e., the deposited material of the getter material on at least a partial area of the inner surface of the second cavity) is continuously reformed as long as the getter material is heated, and vaporizable or sublimatable getter material is still present. This means that no expensive, complicated porous layers to be produced for the method according to the present invention are necessary, so that, at least in a first approximation, the quantity of the gettered gas may be controlled solely via the heating time of the getter material.

Embodiments and refinements of the present invention are described below with reference to the figures.

According to the present invention, it is particularly preferred that a first micromechanical structure, in particular an acceleration sensor, is situated in the first cavity, and a second micromechanical structure, in particular a yaw rate sensor, is situated in the second cavity. However, according to the present invention it is also possible to provide the micromechanical device with three or more cavities, and to set a different pressure in each cavity. For example, an acceleration sensor (first cavity), a yaw rate sensor (second cavity), and a magnetic sensor may be enclosed in one cavity each, and the pressure best suited for the application is set in each of the three cavities. According to the present invention, it is provided in a particularly advantageous manner that a portion of the surface of the second cavity is used for depositing the getter material so that a good getter effect may be achieved. According to one preferred refinement of the present invention, it is provided that the first cavity has a first gas composition—in particular including a first gas having a first partial pressure, the first gas including a gas or multiple gases of main group VIII of the periodic table of the elements, and a second gas, which is different from the first gas, having a second partial pressure—and that the second cavity has a second gas composition, in particular including generally the first gas, the second gas pressure generally corresponding to the first partial pressure. According to the present invention, it is thus possible in a particularly advantageous manner for the second gas pressure in the second cavity to be settable in a particularly precise manner. When the housing of the micromechanical device is closed, i.e., when the first and the second cavities are simultaneously closed, a first gas composition is enclosed in both cavities, the first gas composition having a noble gas or a mixture of various noble gases (i.e., a gas or multiple gases of main group VIII of the periodic table of the elements) as a first component or as a first gas, while a second gas or a second gas mixture is not a noble gas or has no noble gas component. The first gas or the first gas mixture has a first partial pressure, and the second gas or the second gas mixture has a second partial pressure. After the getter step is carried out during the manufacture of the micromechanical device, it is in particular provided according to the present invention that the second gas or the second gas mixture, which is more reactive in relation to the getter material, is bound or adsorbed by the getter material, and only the first gas or the first gas mixture with its first partial pressure remains in the second cavity as the second gas pressure. A particularly precise setting of the reduced second gas pressure is thus possible according to the present invention.

Furthermore, it is preferably provided according to the present invention that the heating element is implemented as an isolated structure, in particular as a thermally decoupled structure. It is thus advantageously possible according to the present invention to achieve relatively high temperatures during the heating of the getter material, in particular for the sublimation of a titanium material, for example. According to the present invention, the isolated structure of the heating element may be advantageously achieved using the available layer sequences of the process for manufacturing the micromechanical structures of the first and the second cavities. An isolated, doped silicon structure on which the sacrificial material is situated via a barrier layer is advantageous. In this regard, the current flow occurs only through the isolated silicon, for example. The silicon structure itself, i.e., the heating element, is connected to the substrate material only via two fine webs, for example, for bringing about good heat decoupling with respect to the remaining substrate material.

According to the present invention, the housing is preferably formed by a substrate which includes the first micromechanical structure and the second micromechanical structure, and a cap substrate which is connected to the substrate. The first and the second cavities are situated between the substrate and the cap substrate, the substrate as well as the cap substrate normally having recesses and connecting webs such that the caverns are closed when the substrate and the cap substrate are joined together and connected via a connecting layer, for example a seal glass layer, or produced with the aid of a further connecting process. In particular, the cap substrate has such a surface structure in an area opposite from the heating element, in that the surface structure implements an enlarged surface of the cap substrate, so that the largest possible surface having a getter effect is achievable when the getter material vaporizes and deposits in this enlarged surface area of the cap substrate.

With regard to the manufacturing method according to the present invention, it is particularly preferred that when the second cavity is closed, the first gas composition (i.e., the same as in the first cavity) is also present in the second cavity, the heating of the heating element in the third method step being carried out in such a way that after the third method step the second cavity has the above-mentioned second gas composition; i.e., in particular the second gas composition of the second cavity after carrying out the third method step is such that generally only the noble gas components (i.e., the above-mentioned first gas or the multiple first gases of main group VIII of the periodic table) are present, and the remaining gas components are generally bound by the getter material. In addition, it is preferred according to the present invention, in particular with regard to the manufacturing method according to the present invention, that after the second method step has concluded and before the third method step has started, the first cavity and the second cavity have the above-mentioned first gas composition, the heating of the heating element in the third method step being carried out in such a way that after the third method step the second cavity has the above-mentioned second gas composition.

Exemplary embodiments of the present invention are illustrated in the figures and explained in greater detail below.

DETAILED DESCRIPTION OF EXAMPLE EMBODIMENTS

Figure 1:
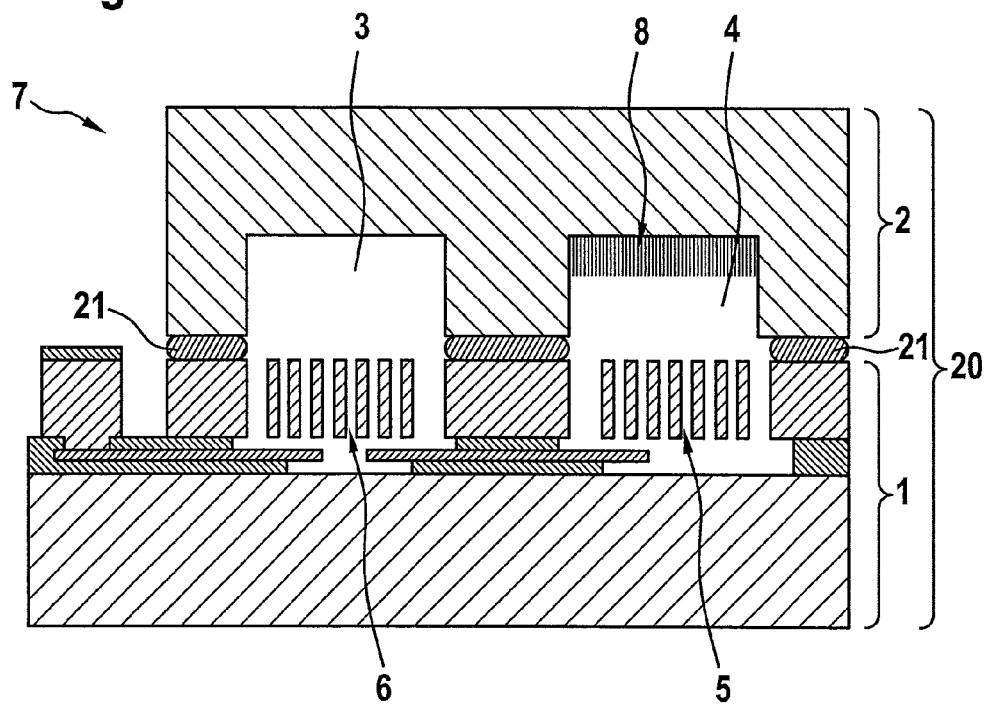
FIG. 1 schematically shows a first specific embodiment of a micromechanical device according to the present invention.

Identical parts are provided with the same reference numerals in the various figures, and therefore are generally designated or mentioned only once in each case.

FIGS. 1 through 5 each show schematic sectional illustrations of a micromechanical device 7 according to the present invention, FIG. 1 illustrating a first specific embodiment and FIGS. 2 through 5 illustrating a second specific embodiment of micromechanical device 7. Micromechanical device 7 has a first cavity 3, a second cavity 4, and a housing 20. According to the present invention, housing 20 is formed by a substrate 1 and a cap substrate 2, for the preferably hermetic closure of first and second cavities 3, 4, substrate 1 and cap substrate 2 being connected to one another via a connecting layer 21 or via a connecting area 21, so that first cavity 3 and second cavity 4 are permanently closed off from the surroundings of micromechanical device 7 as well as from one another, in particular hermetically sealed. Micromechanical device 7 has a first micromechanical structure 6, in particular an acceleration sensor, in first cavity 3, and has a second micromechanical structure 5, in particular a yaw rate sensor, in second cavity 4. However, first and second micromechanical structures 6, 5 are only schematically indicated in FIGS. 1 through 5, and may be implemented, for example, in a functional layer of substrate 1, in particular as a polycrystalline functional layer, for example in the form of polycrystalline silicon material.

According to a first specific embodiment of micromechanical device 7, second cavity 4 has a getter layer 8 which is activatable, for example, via a heat input introduced into a portion of micromechanical device 7, in particular cap substrate 2 of second cavity 4, and therefore the gas composition originally present in second cavity 4 is able to change. According to the present invention it may be provided, for example, that the cap substrate is provided in such a way that getter layer 8 is locally heatable from the outside in a targeted manner after housing 20 is closed, for example in that a portion of cap substrate 2 has a high thermal conductivity and another subarea of cap substrate 2 has a lower thermal conductivity.

Figure 2:
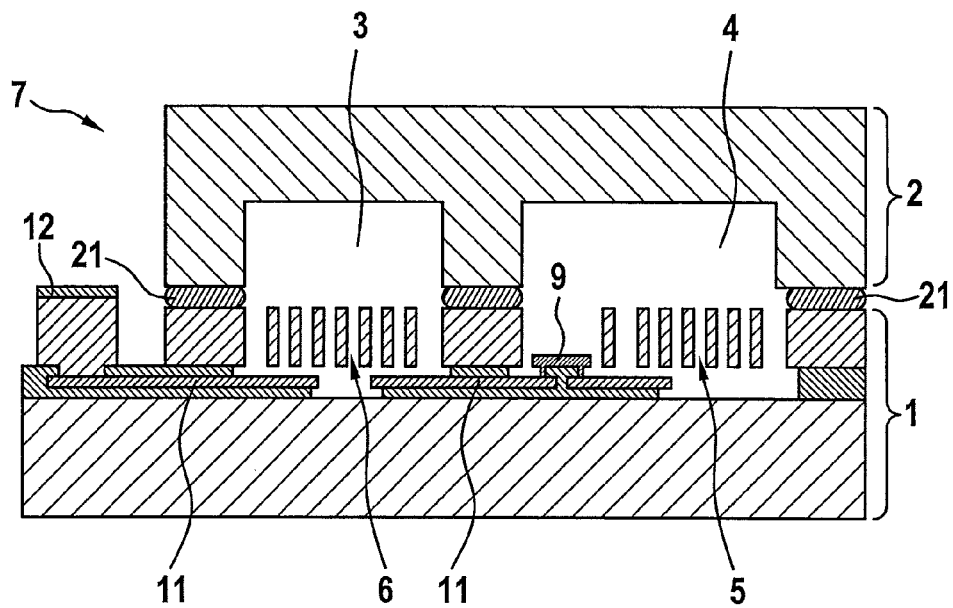
FIGS. 2 through 5 show various variants of a second specific embodiment of the micromechanical device according to the present invention.
Figure 3:
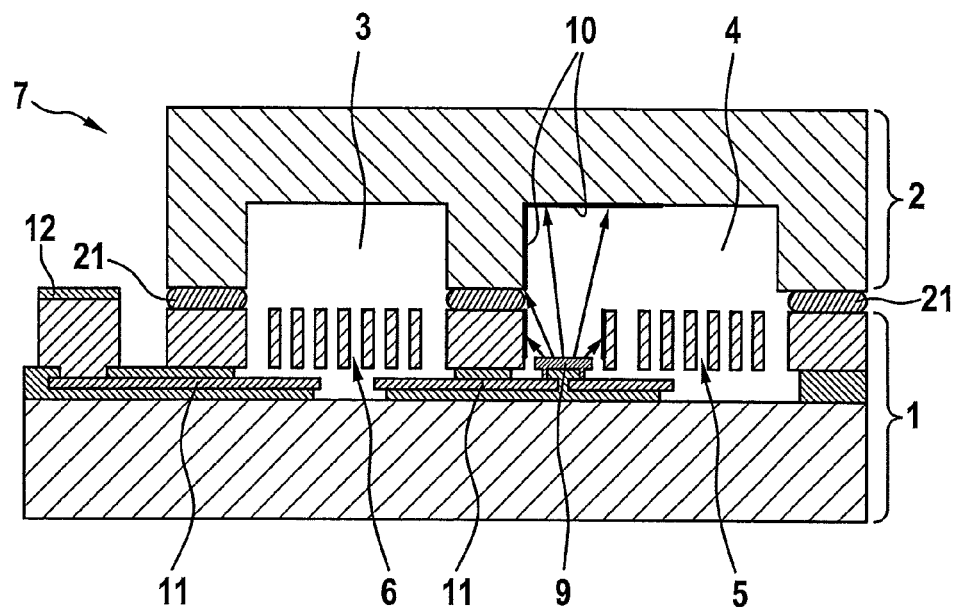
Figure 4:
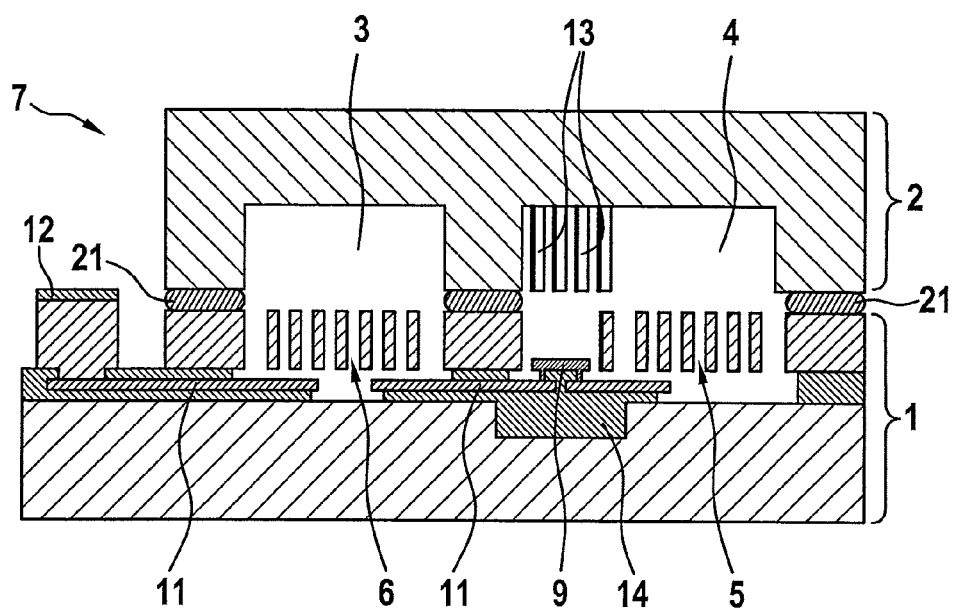
Figure 5:
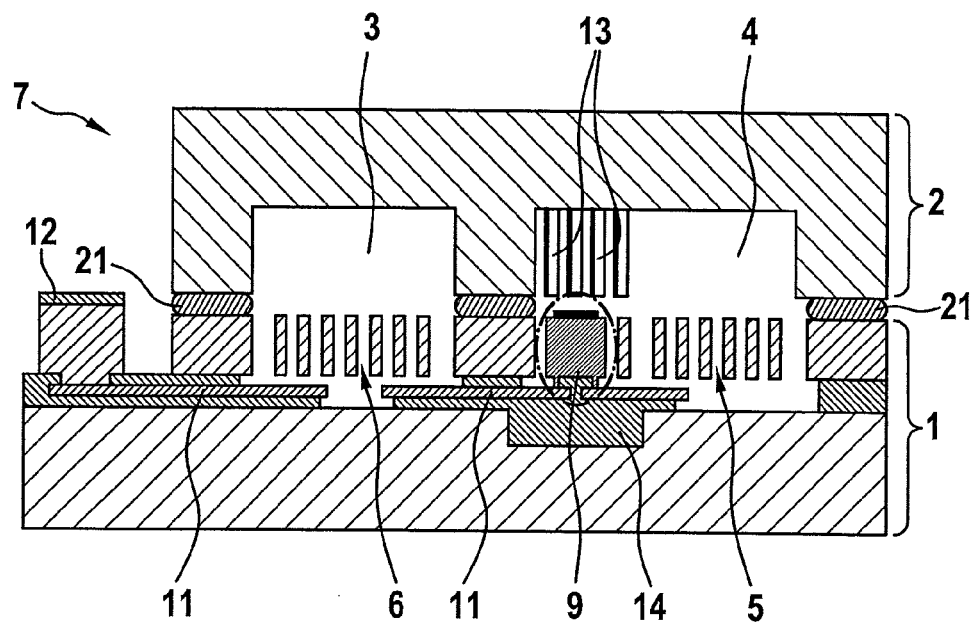
Figure 6:
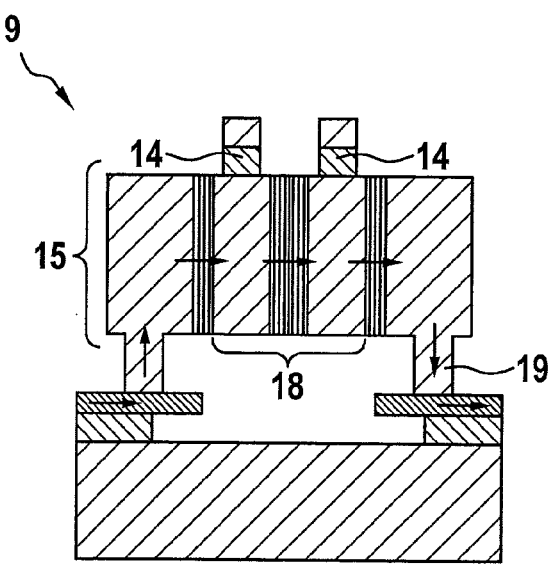
FIGS. 6 and 7 schematically show a sectional illustration and a top view, respectively, of a heating element of the example micromechanical device according to the present invention.
Figure 7:
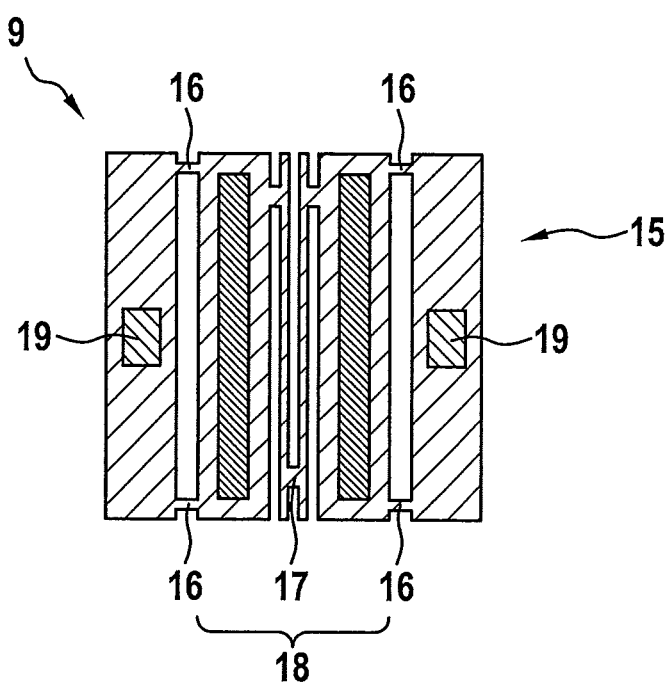

According to a second specific embodiment of the present invention, it is provided according to the present invention that in the area of second cavity 4, micromechanical device 7 has a heating element 9, which is illustrated in various embodiment variants in FIGS. 2 through 5 as well as FIGS. 6 and 7. According to the present invention, heating element 9 is externally contactable or connectable, in particular to a printed conductor 11, in particular in the form of a buried printed conductor 11 (or to multiple, in particular two, printed conductors), in such a way that, as the result of externally applying a current flow in heating element 9 (via printed conductor 11) and in particular with the aid of a contact surface 12 of micromechanical device 7 which is externally accessible or contactable, an electrical current flow, and, via the ohmic resistance of the heating element, a resulting heating of heating element 9, may be brought about. According to the second specific embodiment of the present invention, it is provided that a getter material in the form of a sacrificial layer is situated in the area of heating element 9, so that heating, and therefore activation of the getter material of the sacrificial layer, results from actuating or activating heating element 9. In this regard, FIG. 2 illustrates micromechanical device 7 according to the second specific embodiment, prior to the activation of the heating element and the activation of the getter material of the sacrificial layer, while FIGS. 3, 4, and 5 illustrate variants of the micromechanical device after the getter material is activated by heating the sacrificial layer due to the activation of heating element 9.

According to the present invention, according to the first and also the second specific embodiment the micromechanical device is illustrated in each case only with first and second cavities 3, 4. However, implementation of a micromechanical device having more than two cavities is likewise possible, so that further sensors such as an acceleration sensor and a yaw rate sensor are implementable in the additional cavities. In all cavities, i.e., in particular in first and second cavities 3, 4, a defined gas pressure having a defined gas composition is enclosed, and as a result, housing 20 is closed at the same time for all cavities; i.e., substrate 1 and cap substrate 2 are connected to one another when a defined gas composition and a defined pressure are present. The enclosed gas pressure or the gas composition is in particular optimized for the micromechanical structure and its mode of operation in first cavity 3, i.e., for the acceleration sensor, for example. This gas composition is also referred to below as the first gas composition. It preferably includes a first gas having a first partial pressure, the first gas including a gas or multiple gases of main group VIII of the periodic table of the elements, i.e., a noble gas or a mixture of noble gases. In addition, the first gas composition includes a second gas or a gas mixture having a second partial pressure, the second gas having no noble gases or noble gas components. It is thus possible to select the first gas composition in such a way that after the getter material is activated, the residual gas pressure in the second cavern or in another cavern is determined by the starting pressure (i.e., the first gas pressure) in the particular cavern and by the gas composition. A first gas composition having a noble gas and a non-noble gas is particularly advantageous, since the noble gas component (i.e., the first gas) is not bound by the usual getter processes and getter materials, and therefore the target pressure in second cavern 4 (second gas pressure) is settable via the suitable selection of the noble gas partial pressure (first partial pressure). It is advantageous here that the getter process may advantageously be carried out for a comparatively long time until only the noble gas component, i.e., the first gas, is present in second cavity 4, resulting in a very robust and simple method for manufacturing micromechanical device 7. In many cases, however, for example for yaw rate sensors, it is desirable to manufacture components having precisely defined damping due to the gas pressure of the micromechanical structure. The damping is provided by the gas pressure in the particular cavern and by the geometry of the movable and the nonmovable structures of the micromechanical structure. The geometry may vary due to the manufacturing process, so that it may be advantageous to set different pressures (second gas pressures) in second cavity 4, depending on the component, in order to always achieve the same damping. For this purpose, according to the present invention it is beneficial and advantageous to coordinate the getter process and the getter effect with the particular component, and, for example, to carry out the process for different periods of time, while at the same time measuring the resulting damping. Thus, according to the present invention the getter process may be advantageously controlled by measuring the damping of the component.

In a first variant of the second specific embodiment of the present invention according to FIGS. 2, 3, and 4, a low-resistance connection between outer terminals 12 and the sacrificial layer is provided to the outside via a buried printed conductor 11. In the simplest case, the current flow may be provided directly through the sacrificial layer, i.e., the getter material. The sacrificial layer itself thus acts as heating element 9. The sacrificial layer is situated in such a way that a high electrical resistance relative to the supply lines, i.e., printed conductor 11, results. Thus, the sacrificial layer may be well heated locally by an externally applied current flow. According to the present invention, it is advantageous when the sacrificial layer, i.e., the getter material, is situated on the sensor side, i.e., not on cap substrate 2, but instead as part of substrate 1, so that the getter material sublimates into second cavern 4 when heated, as illustrated in FIG. 3 in the form of getter material 10. The situation may thus be avoided that the getter material adversely affects the sensor functional elements, i.e., second micromechanical structure 5. According to another variant of the second specific embodiment of the present invention, however, the actual sublimation process may be carried out in a virtually separated or separate subcavity of second cavity 4 in order to protect the sensor element of second cavity 4, i.e., second micromechanical structure 5, from possible harmful vapor deposition with getter material 10. However, this variant of a virtually separate subcavity of second cavity 4 is not explicitly illustrated in the figures. According to another variant of the second specific embodiment of the present invention, it may be provided that, in particular in the area of the surface of cap substrate 2, an enlarged surface area is provided on which getter material 10 is deposited. For example, grooves or holes 13 may be provided in the cap substrate to produce the largest possible surface per lateral extension (along a main plane of extension of substrate 1 or of cap substrate 2), thus achieving a very high pump efficiency in the getter process (i.e., after getter material 10 is activated by heating the sacrificial layer). Instead of grooves or holes 13 in cap substrate 2 illustrated in FIGS. 4 and 5, in another variant it may also be provided according to the present invention that so-called black silicon is produced in the cap substrate, at least in areas, by specialized etching processes and used as a deposition surface for getter material 10. In addition, according to another variant of the micromechanical device according to the present invention, in particular according to the second specific embodiment according to FIG. 4, it may be provided that a barrier layer 14 is provided between the sacrificial layer and the substrate material of substrate 1, or between the sacrificial layer and one of the sensor layers, thus preventing diffusion processes of the sacrificial layer, i.e., the getter material, into the base (i.e., into the material of substrate 1), or preventing chemical reactions of the getter material with the base or structures of the micromechanical functional layer. It is particularly advantageous to use a material of barrier layer 14 which has comparatively poor thermal conductivity in order to be able to heat the getter layer, i.e., the sacrificial layer, more easily, for example with the aid of a thick oxide layer having a thickness of 1 µm to 30 µm, for example, and made of silicon dioxide, for example. For the case that getter materials, for example titanium, are used, relatively high temperatures are necessary to achieve good sublimation characteristics for activating the getter material. In these cases it may be advantageous to provide specialized heating structures for the sacrificial layer, using the available layer sequences of the sensor process. In this regard, an isolated, doped silicon structure on which the sacrificial layer is situated via a barrier layer is advantageous. The current flow of heating element 9 occurs solely through an isolated silicon element, which is illustrated in a sectional illustration in FIG. 6 and in a top view in FIG. 7. In the illustrated embodiment variant of the second specific embodiment, heating element 9 in the form of an isolated silicon structure 15 is connected to a suspension, and thus to substrate 1, as part of isolated silicon structure 15 via two or more fine webs 16, i.e., in particular having a thin cross section. This results in good heat decoupling with respect to the remaining material of substrate 1, i.e., with respect to the chip of micromechanical device 7. The electrical connection to the printed conductor or to the plurality of printed conductors, and thus to external contact surfaces 12, is established with the aid of contact areas 19 for buried printed conductor 11. Heating elements may be implemented within the isolated structure with the aid of fine structures 17, and the structure together with the sacrificial layer may be heated within heat decoupling 18.

What is claimed is:

1. A micromechanical device, comprising:
a housing including a first cavity, and a second cavity that is separate from the first cavity, the micromechanical device being configured in such a way that a predetermined first gas pressure prevails in the first cavity, and a predetermined second gas pressure which is reduced compared to the first gas pressure prevails in the second cavity;
a heating element situated in an area of the second cavity; and
a printed conductor, the heating element being heatable with the aid of the printed conductor;
wherein the housing includes a substrate which includes a first micromechanical structure and a second micromechanical structure, and a cap substrate which is connected to the substrate, the first and the second cavities being situated between the substrate and the cap substrate, the cap substrate having surface structures that provide an enlarged surface area in an area opposite from the heating element;
wherein at least a portion of the surface of the second cavity has a vaporizable getter material such that the second gas pressure prevails in the second cavity,
wherein an isolated silicon structure that is thermally decoupled from the substrate is mechanically coupled to the substrate via a plurality of fine webs, and
wherein the heating element is thermally decoupled from the substrate by being contained exclusively within the isolated silicon structure.

2. The micromechanical device as recited in claim 1, wherein the micromechanical device is a sensor device.

3. The micromechanical device as recited in claim 1, wherein the printed conductor is a buried printed conductor.

4. The micromechanical device as recited in claim 1, wherein:
the first micromechanical structure is situated in the first cavity, and the second micromechanical structure is situated in the second cavity, the first micromechanical structure being an acceleration sensor, and the second micromechanical structure being a yaw rate sensor.

5. The micromechanical device as recited in claim 1, wherein the first cavity has a first gas composition including a first gas having a first partial pressure, the first gas including at least one gas of main group VIII of the periodic table of the elements, and a second gas, which is different from the first gas, having a second partial pressure, and the second cavity has a second gas composition, including the first gas, the second gas pressure corresponding to the first partial pressure.

* * * * *